United States Patent [19]

Faraone

[11] Patent Number: 4,755,481

[45] Date of Patent: Jul. 5, 1988

[54] METHOD OF MAKING A SILICON-ON-INSULATOR TRANSISTOR

[75] Inventor: Lorenzo Faraone, Belle Mead, N.J.

[73] Assignee: General Electric Company, Schenectady, N.Y.

[21] Appl. No.: 863,432

[22] Filed: May 15, 1986

[51] Int. Cl.$^4$ ............................................. H01L 21/38
[52] U.S. Cl. ........................................... 437/62; 437/84
[58] Field of Search ..................... 29/576 E, 576 W; 148/175, 187; 437/62, 84

[56] References Cited

U.S. PATENT DOCUMENTS

| | | | |
|---|---|---|---|
| 3,511,702 | 5/1970 | Jackson, Jr. et al. | 117/212 |
| 3,740,280 | 6/1973 | Ronen | 156/11 |
| 3,890,632 | 6/1975 | Ham et al. | 357/23 |
| 3,943,542 | 3/1976 | Ho et al. | 357/23 |
| 3,974,515 | 8/1976 | Ipri et al. | 357/23 |
| 4,002,501 | 1/1977 | Tamura | 148/1.5 |
| 4,016,016 | 4/1977 | Ipri | 148/175 |
| 4,076,573 | 2/1978 | Shaw et al. | 29/576 E |
| 4,160,260 | 7/1979 | Weitzel et al. | 357/23 |
| 4,174,217 | 11/1979 | Flatley | 96/36.2 |
| 4,178,191 | 12/1979 | Flatley | 148/1.5 |
| 4,183,134 | 1/1980 | Oehler et al. | 29/571 |
| 4,199,384 | 4/1980 | Hsu | 148/175 X |
| 4,199,773 | 4/1980 | Goodman et al. | 357/23 |
| 4,242,156 | 12/1980 | Peel | 148/175 |
| 4,252,582 | 2/1981 | Anantha et al. | 148/175 |
| 4,263,709 | 4/1981 | Weitzel et al. | 29/578 X |
| 4,277,884 | 7/1981 | Hsu | 29/571 |
| 4,313,809 | 2/1982 | Benyon | 204/192 |
| 4,323,910 | 4/1982 | Sokoloski et al. | 357/23 |
| 4,341,569 | 7/1982 | Yaron et al. | 148/1.5 |
| 4,356,623 | 11/1982 | Hunter | 29/571 |
| 4,368,085 | 1/1983 | Peel | 148/33.3 |
| 4,385,937 | 5/1983 | Ohmura | 148/1.5 |
| 4,393,572 | 7/1983 | Policastro et al. | 29/571 |
| 4,393,578 | 7/1983 | Cady et al. | 29/576 B |
| 4,395,726 | 7/1983 | Maeguchi | 357/41 |
| 4,447,823 | 5/1984 | Maeguchi et al. | 357/23 |
| 4,455,738 | 6/1984 | Houston et al. | 29/571 |
| 4,472,459 | 9/1984 | Fisher | 29/576 W |
| 4,491,856 | 1/1985 | Egawa et al. | 357/4 |
| 4,523,963 | 6/1985 | Ohta et al. | 148/1.5 |
| 4,533,934 | 8/1985 | Smith | 357/23.7 |
| 4,547,231 | 10/1985 | Hine | 148/175 |
| 4,557,794 | 12/1985 | McGinn et al. | 156/612 |
| 4,604,304 | 8/1986 | Faraone et al. | 427/255 |
| 4,658,495 | 4/1987 | Flatley et al. | 29/571 |

FOREIGN PATENT DOCUMENTS 0179719 4/1986 European Pat. Off. .
133667 8/1982 Japan .................. 148/186

OTHER PUBLICATIONS

K. Tanno et al., "Selective Silicon Epitaxy Using Reduced Pressure Technique", Jap. of Appl. Phys., vol. 21, No. 9, Sep. 1982, pp. L564–566.

Ansell et al., "CMOS in Radiation Environments", VLSI Systems Design, Sep. 1986, pp. 28–36.

Hughes et al., "Oxide Thickness Dependence of High--Energy-Electron-, VUV-, and Corona-Induced Charge in MOS Capacitors", Applied Physics Letters, vol. 29, No. 6, Sep. 15, 1976, pp. 377–379.

Naruke et al., "Radiation-Induced Interface States of Poly-Si Gate MOS Capacitors Using Low Temperature Gate Oxidation", IEEE Transactions on Nuclear Science, vol. NS-30, No. 6, Dec. 1983, pp. 4054–4058.

Saks et al., "Radiation Effects in MOS Capacitors with Very Thin Oxides at 80° K.", IEEE Transactions on Nuclear Science, vol. NS-31, No. 6, Dec. 1984, pp. 1249–1255.

W. E. Ham et al., "The Study of Microcircuits by Transmission Electron Microscopy", RCA Review, vol. 38, Sep. 1977, pp. 351–389.

J. S. Chang, "Selective Reactive Ion Etching of Silicon Dioxide", Solid State Technology, Apr. 1984, pp. 214–219.

Primary Examiner—George T. Ozaki
Attorney, Agent, or Firm—Bernard F. Plantz; James M. Trygg; Allen LeRoy Limberg

[57] ABSTRACT

A silicon-on-insulator (SOI) device is fabricated by forming at least one island of semiconductor material on a surface of an insulating material. Silicon is then formed on the areas which surround the at least one island. The silicon is oxidized to form silicon dioxide regions which surround the at least one island.

18 Claims, 3 Drawing Sheets

METHOD OF MAKING A SILICON-ON-INSULATOR TRANSISTOR

The present invention relates to a method of fabricating a silicon-on-insulator (SOI) transistor. More particularly, the method of the present invention relates to the formation of silicon dioxide in the areas surrounding the active device structures.

BACKGROUND OF THE INVENTION

Silicon-on-insulator (SOI) transistors, such as silicon-on-sapphire (SOS), are generally known in the art. These transistors generally include a substrate of insulating material, such as sapphire, with a plurality of single crystalline silicon islands formed thereon. The structure can then be planarized by depositing an insulating material, such as silicon dioxide, on the areas which surround the islands. Conventional masking and doping techniques are then used to form MOS field-effect transistors and other devices in and on the silicon islands.

There are a number of techniques in the prior art for forming these structures. One such technique is described in commonly assigned U.S. Pat. No. 3,740,280 entitled METHOD OF MAKING SEMICONDUCTOR DEVICE issued June 19, 1973 to R. S. Ronen. An SOS semiconductor device is fabricated by first forming a plurality of single crystalline silicon islands on an insulating substrate, such as sapphire or spinel. An opaque masking layer is then formed on the top surfaces of the silicon islands. An insulating material, such as silicon dioxide, is coated over the exposed portions of the substrate between and around the islands and over the opaque masking layer. A photosensitive resist is then coated over the insulating layer. Light is directed onto the uncovered surface of the substrate so as to expose portions of the photoresist which do not overlie the opaque masking layer. The portions of the photoresist which overlie the opaque masking material are removed using a conventional solvent. Using the remaining photoresist as a mask, the insulating material directly overlying the silicon island is removed using a conventional etching technique. Then, the opaque masking layer is removed so as to expose the top surfaces of the silicon islands. Various active and passive components are then formed in or on each of the silicon islands using techniques well known in the art.

A second method for forming silicon-on-sapphire devices is disclosed in commonly assigned U.S. Pat. No. 4,178,191 entitled PROCESS OF MAKING A PLANAR MOS SILICON-ON-INSULATING SUBSTRATE DEVICE issued Dec. 11, 1979 to D. W. Flatley. Epitaxial silicon is first grown on the planar surface of the sapphire substrate. Then, a plurality of masking layers are applied to the epitaxially grown silicon. Portions of the masking layers are removed to expose selected regions of the epitaxial silicon layer. An anisotropic silicon etchant is applied to the unmasked surfaces of the silicon layer. The unmasked silicon is etched down to a depth of about half of its original thickness. The remaining exposed silicon is then thermally oxidized to form silicon dioxide in the areas which surround the epitaxial silicon islands.

The above prior art processes have numerous drawbacks. The process described in U.S. Pat. No. 3,740,280 requires light to be directed onto the uncovered or bottom surface of the substrate. However, the exposure apparatus used in a conventional semiconductor manufacturing operation is designed to direct light toward the top or coated surface of the substrate. Thus, the conventional semiconductor manufacturing line must be modified to include a special exposure apparatus which has the capabilities of shining light toward the bottom or uncoated surface of the substrate.

The process described in U.S. Pat. No. 4,178,191 has a disadvantage of requiring the epitaxial silicon to be etched to a depth of about half of its original thickness. It is very difficult in the etching art to repeatedly etch epitaxial silicon to a desired depth. If the epitaxial silicon is not etched to the proper depth, the subsequent oxidation step will produce a silicon dioxide layer which is not substantially coplanar with the silicon islands. Additionally, if the silicon is etched to less than the prescribed depth, the subsequent oxidation step may not oxidize all of the silicon between the islands. The remaining silicon can form a conductive path between the active devices formed in the silicon islands.

SUMMARY OF THE INVENTION

A method of making a semiconductor device by forming at least one island of semiconductor material on the surface of an insulating material and forming silicon on the areas which surround the island. The silicon is then oxidized to form silicon dioxide regions which surround the at least one island.

DETAILED DESCRIPTION OF THE PREFERRED EMBODIMENT

Figure 1A:
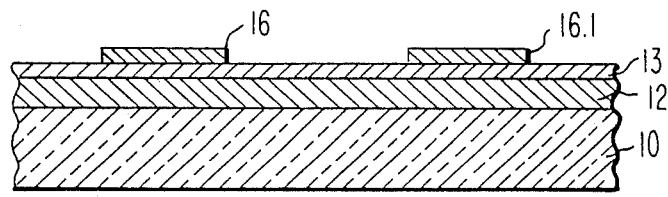
FIGS. 1a to 1f are sectional views illustrating the various steps of the method of the present invention for making a silicon-on-sapphire (SOS) semiconductor device.

Referring to FIGS. 1a to 1f, a silicon-on-sapphire (SOS) transistor will be fabricated using the method of the present invention. However, other insulating substrate materials, such as spinel, beryllium oxide, silicon dioxide, or the like, may be substituted for sapphire. As shown in FIG. 1a, a layer 12 of single crystalline silicon is formed on the planar surface of the sapphire substrate 10. The single crystalline silicon layer 12 can be grown by reacting silane or a silicon halide with hydrogen at a temperature of about 900°–1200° C. Alternatively, amorphous or polycrystalline silicon can be deposited on the surface of the substrate 10 and then recrystallized to form single crystalline silicon. The single crystalline silicon layer 12 typically has a thickness of about 5000 Å. An oxidation resistant masking layer 13 is then applied to the single crystalline silicon layer 12. The oxidation resistant masking layer 13 typically has a thickness of about 1000 Å. The oxidation resistant masking layer 13 may be silicon nitride which has been deposited by reacting silane or a silicon halide with ammonia at a temperature of about 700°–800° C. A layer of photoresist is then applied over the oxidation resistant masking layer 13. The photoresist is patterned using conventional photolithographic techniques to form the regions 16 and 16.1. The photoresist regions 16 and 16.1 cover only the portions of the silicon layer 12 used to form the silicon islands.

Figure 1B:
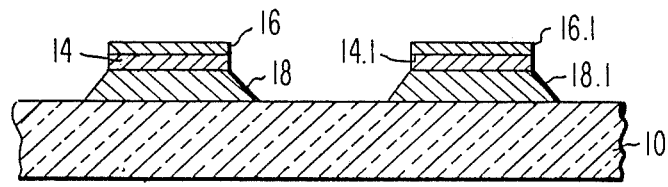

Next, the areas of the masking layer 13 not subtended by the photoresist regions 16 and 16.1 are removed using conventional plasma or wet etching techniques. The remaining regions of the oxidation resistant masking layer 13 form the oxidation resistant masks 14 and 14.1. This etching operation exposes portions of the single crystalline silicon layer 12. The exposed portions of the single crystalline silicon layer 12 are removed using an anisotropic silicon etchant, such as potassium hydroxide. FIG. 1b illustrates that when potassium hydroxide is utilized, the silicon islands 18 and 18.1 have tapered sidewalls. Alternatively, the exposed portions of the single crystalline silicon layer 12 may be removed using a reactive ion etching technique. However, when reactive ion etching is utilized the sidewalls of the silicon islands 18 and 18.1 will be vertical. The photoresist regions 16 and 16.1 are then removed.

Figure 1C:
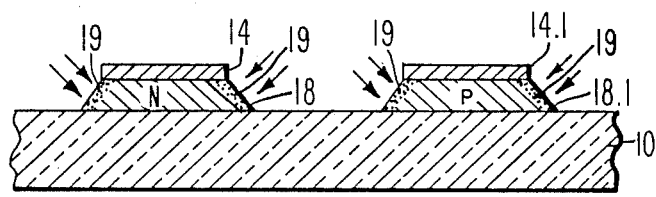

The silicon islands 18 and 18.1 are doped using a process similar to the one described in commonly assigned U.S. Pat. No. 4,199,773 entitled INSULATED GATE FIELD EFFECT SILICON-ON-SAPPHIRE TRANSISTOR AND METHOD OF MAKING SAME issued Apr. 22, 1980 to A. M. Goodman et al. which is hereby incorporated by reference. The conductivity of the island will depend on whether p-channel or n-channel devices are being fabricated. For illustrative purposes only, the island 18 is doped with an n-type dopant, such as phosphorus, while the island 18.1 is doped with a p-type dopant, such as boron. The resulting structure is shown in FIG. 1c. Alternatively, the doping operation described above could be carried out later in the process, such as after the steps illustrated in FIG. 1d or FIG. 1e.

The sidewalls of the silicon islands 18 and 18.1 are then optionally doped with a dopant of the same conductivity type as that of the island. Thus, the regions 19 extending inwardly from the sidewalls will have a higher conductivity modifier concentration than that of the island. The sidewalls are doped using a process similar to the one described in commonly assigned U.S. Pat. No. 3,890,632 entitled STABILIZED SEMICONDUCTOR DEVICES AND METHOD OF MAKING SAME issued June 17, 1975 to W. E. Ham et al. which is hereby incorporated by reference.

Figure 1D:
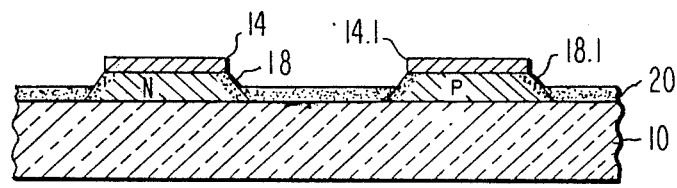
Figure 1E:
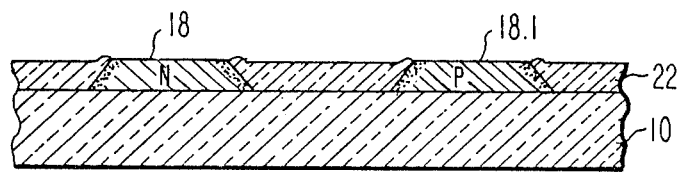

As shown in FIG. 1d, a layer 20 of intrinsic epitaxial silicon is formed on the sapphire substrate 10 in the areas which surround the silicon islands 18 and 18.1. A selective epitaxial growth technique is utilized to grow the intrinsic epitaxial silicon on the single crystalline silicon islands 18 and 18.1 and on the single crystal sapphire substrate 10. There will be no growth of intrinsic epitaxial silicon on any amorphous surface, such as the silicon nitride masks 14 and 14.1. Selective epitaxial growth is typically carried by heating the substrate to a temperature of about 900°–1200° C. in a reduced pressure atmosphere comprising silane or a silicon halide, a hydrogen halide and hydrogen. Selective epitaxial growth techniques are described in U.S. Pat. No. 3,511,702 entitled EPITAXIAL GROWTH PROCESS FROM AN ATMOSPHERE COMPOSED OF A HYDROGEN HALIDE, SEMICONDUCTOR HALIDE AND HYDROGEN issued May 12, 1970 to D. M. Jackson et al. and in the article by K. Tanno et al. entitled SELECTIVE SILICON EPITAXY USING REDUCED PRESSURE TECHNIQUE, Japanese Journal of Applied Physics, Vol. 21, No. 9, Sept. 1982, pp. L564–L566. The intrinsic epitaxial silicon layer 20 has a thickness of approximately 2500 Å which corresponds to approximately half of the thickness of the island 18 or 18.1.

The structure shown in FIG. 1d is then heated to a temperature of about 800° C. in an oxidizing atmosphere comprising steam and oxygen. The intrinsic epitaxial silicon layer 20 surrounding the silicon islands 18 and 18.1 is completely oxidized to form the silicon dioxide regions 22 shown in FIG. 1e. When the intrinsic epitaxial silicon layer 20 is deposited to a thickness of approximately half of the thickness of the island 18 or 18.1, a substantially planarized structure is produced when the intrinsic epitaxial silicon is completely oxidized. Alternatively, if it is not desirable to have a planarized structure, the intrinsic epitaxial silicon layer 20 in FIG. 1d should be deposited to a thickness of approximately half of the desired final oxide thickness. The oxidation resistant masks 14 and 14.1 are then removed using a conventional wet etchant, such as $H_3PO_4$.

Figure 1F:
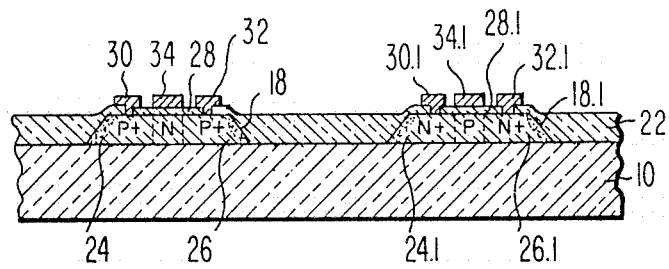

As shown in FIG. 1f, transistors are formed in the islands 18 and 18.1 using conventional techniques, such as the process described in U.S. Pat. No. 4,199,773 to A. M. Goodman et al. The channel oxides 28 and 28.1 are formed on the exposed surfaces of the islands 18 and 18.1. Then, a conductive layer is deposited over the channel oxide layers 28 and 28.1 and patterned to form the gates 34 and 34.1. Portions of the oxide layers 28 and 28.1 are removed to define the sources 24 and 24.1 as well as the drains 26 and 26.1. Using the gates 34 and 34.1 as masks, the sources 24 and 24.1 and the drains 26 and 26.1 are doped using conventional ion implantation or diffusion techniques. Conventional metallization techniques are then utilized to form the contacts 30, 30.1, 32 and 32.1.

As an alternative embodiment of the method illustrated in FIGS. 1a to 1f, a layer of silicon dioxide (not shown) having a thickness of about 100–400 Å is formed on the single crystalline silicon layer 12 before the oxidation resistant masking layer 13 is deposited (see FIG. 1a). This silicon dioxide layer is formed by thermally oxidizing a portion of the single crystalline silicon layer 12. The silicon dioxide layer is used to protect the single crystalline silicon layer 12 from the oxidation resistant masking layer 13, especially when the oxidation resistant masking layer 13 is silicon nitride. The same processing steps illustrated in FIGS. 1b to 1e are used to form the single crystalline silicon islands. However, the silicon dioxide layer (not shown) is removed from the single crystalline silicon islands using plasma or wet etching techniques. Then, the channel oxides 28 and 28.1 are formed on the silicon islands using conventional techniques (see FIG. 1f). The source and drain regions along with the required gates are formed on the islands 18 and 18.1 using the techniques illustrated in FIG. 1f.

Figure 2A:
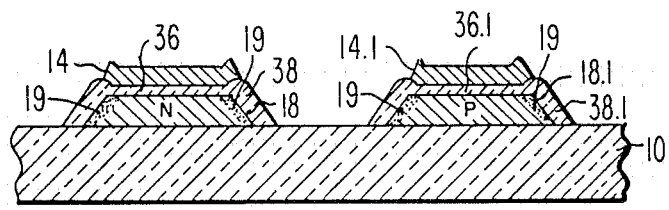
FIGS. 2a to 2c are sectional views illustrating the various steps of an alternative method of the present invention for making a silicon-on-sapphire (SOS) semiconductor device.
Figure 2B:
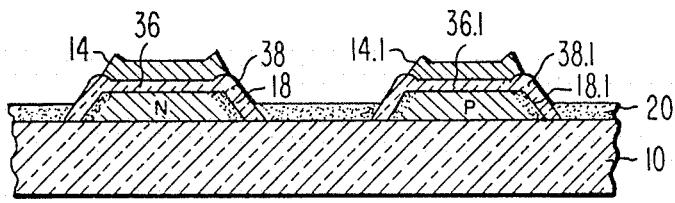
Figure 2C:
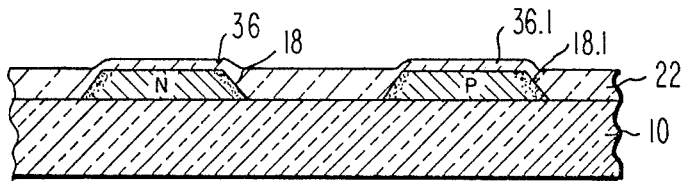

FIGS. 2a to 2c shown alternative method of the present invention for fabricating a silicon-on-sapphire (SOS) semiconductor device. As shown in FIG. 2a, the silicon islands 18 and 18.1, the silicon dioxide layers 36 and 36.1 and the oxidation resistant masking layers 14 and 14.1 are all formed on the sapphire substrate 10 using the process steps described for the alternative embodiment of the method illustrated in FIGS. 1a to 1f. Other insulating substrates, such as spinel, beryllium oxide, silicon dioxide, or the like, may be substituted for sapphire. The sidewall regions 19 of the silicon islands are optionally doped with a dopant of the same conductivity type as that of the island. After the optional doping operation, the sidewalls of the silicon islands 18 and 18.1 are oxidized using the process described in commonly assigned U.S. patent application Ser. No. 590,793 entitled SILICON-ON-INSULATOR TRANSISTOR AND METHOD OF MAKING THE SAME filed on Mar. 19, 1984 by L. Faraone et al. In this process, the sidewalls of the silicon islands 18 and 18.1 are heated to a temperature of about 1000° C. in an atmosphere comprising steam and hydrogen chloride. The silicon dioxide layers 38 and 38.1 on the sidewalls of the islands 18 and 18.1 typically have a thickness of about 500–1000 Å.

After the sidewalls of the silicon islands 18 and 18.1 are oxidized, a selective intrinsic epitaxial growth technique is utilized to grow a layer of intrinsic epitaxial silicon 20 on the sapphire substrate 10 in the areas which surround the silicon islands 18 and 18.1. The intrinsic epitaxial silicon layer 20 typically has a thickness of approximately half of the thickness of the island 18 or 18.1. The resulting structure is shown in FIG. 2b.

The structure shown in FIG. 2b is then heated to a temperature of about 800° C. in an atmosphere comprising oxygen and steam. The intrinsic epitaxial silicon layer 20 is fully oxidized to form the silicon dioxide layer 22 which surrounds the silicon islands 18 and 18.1. The oxidation resistant masking layers 14 and 14.1 are removed. FIG. 2c illustrates that a substantially planarized structure is achieved. The silicon dioxide layers 36 and 36.1 are removed and conventional processing steps, such as those illustrated in FIG. 1f, are used to form transistors and other devices in and on the silicon islands 18 and 18.1.

Figure 3A:
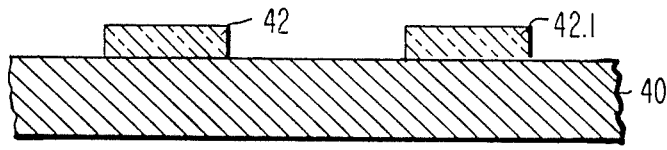
FIGS. 3a to 3f are sectional views illustrating the various steps of the method of the present invention for making a silicon-on-insulator (SOI) semiconductor device.
Figure 3B:
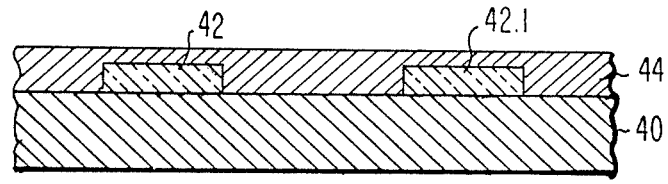

FIGS. 3a to 3f illustrate a further alternative method of the present invention for fabricating a silicon-on-insulator (SOI) semiconductor device. As shown in FIG. 3a, this process begins with a semiconductor substrate 40, such as lightly doped single crystalline silicon. The substrate 40 is then covered with a layer of insulating material, such as silicon dioxide or silicon nitride, using conventional thermal oxidation or chemical vapor deposition techniques. This insulating material has a thickness of greater than about 10,000 Å. The insulating layer is then patterned using conventional photolithographic techniques to form insulating islands 42 and 42.1. The structure shown in FIG. 3a is then covered with a layer 44 of monocrystalline epitaxial silicon using an epitaxial lateral overgrowth (ELO) technique similar to the one described in commonly assigned U.S. Pat. No. 4,557,794 entitled METHOD FOR FORMING A VOID-FREE MONOCRYSTALLINE EPITAXIAL LAYER ON A MASK issued Dec. 10, 1985 to J. T. McGinn et al. which is hereby incorporated by reference. As shown in FIG. 3b the monocrystalline epitaxial silicon layer 44 is grown such that it has a thickness of approximately 5000 Å above the insulating islands 42 and 42.1.

Figure 3C:
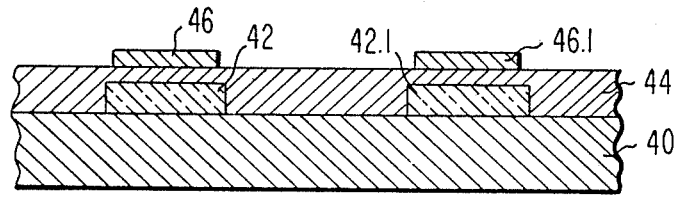

An oxidation resistant masking layer, such as silicon nitride, is then applied to the monocrystalline epitaxial silicon layer 44 using conventional techniques. As shown in FIG. 3c, the masking layer is then patterned using standard photolithographic techniques to form the oxidation resistant masks 46 and 46.1 which overlie the insulating islands 42 and 42.1.

Figure 3D:
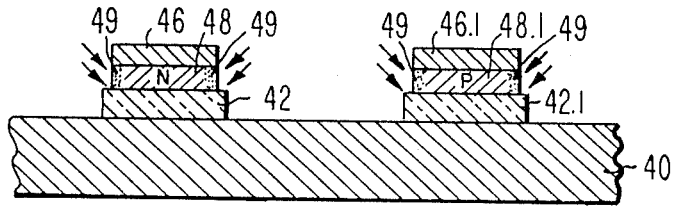

The structure shown in FIG. 3c is then plasma etched so as to remove the portions of the silicon layer 44 which are not subtended by the oxidation resistant masks 46 and 46.1. FIG. 3d illustrates that monocrystalline silicon islands 48 and 48.1 are formed atop the insulating islands 42 and 42.1. The monocrystalline silicon islands 48 and 48.1 can now be doped using techniques similar to those illustrated in FIG. 1c. For illustrative purposes only, the monocrystalline silicon island 48 is doped with an n-type dopant, such as phosphorus, while the monocrystalline silicon island 48.1 is doped with a p-type dopant, such as boron. Alternatively, the monocrystalline silicon islands 48 and 48.1 could be doped after the steps illustrated in FIG. 3e or FIG. 3f. As an optional step, the sidewall regions 49 of the monocrystalline silicon islands 48 and 48.1 may be doped with a dopant of the same conductivity type as that of the monocrystalline silicon island. The same technique described for the method illustrated in FIGS. 1a to 1f is utilized to increase the conductivity modifier concentration of the sidewall regions 49 of the monocrystalline silicon islands 48 and 48.1.

Figure 3E:
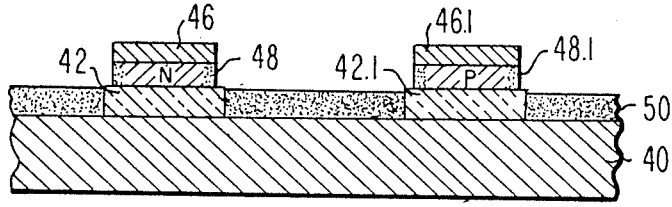

The structure shown in FIG. 3d is then coated with a layer 50 of intrinsic epitaxial silicon. A selective epitaxial growth (SEG) technique is utilized so that intrinsic epitaxial silicon is not grown on the amorphous oxidation resistant masks 46 and 46.1. The selective epitaxial growth technique used in FIG. 3e is similar to the technique used in FIG. 1d. The intrinsic epitaxial silicon layer 50 has a thickness of about 7500 Å which is approximately half of the total thickness of the insulating island 42 or 42.1 and the silicon island 48 or 48.1.

Figure 3F:
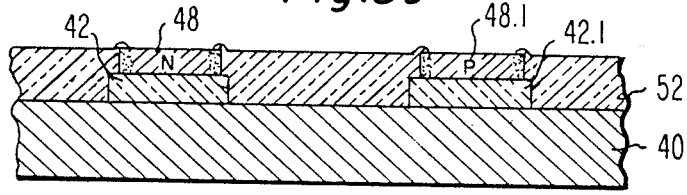

The structure shown in FIG. 3e is then heated to a temperature of about 800° C. in an atmosphere comprising oxygen and steam. The intrinsic epitaxial silicon layer 50 is completely oxidized to form the silicon dioxide regions 52. As shown in FIG. 3f, a substantially planarized upper surface is achieved with this process. However, if a non-planarized surface is desired, the intrinsic epitaxial silicon layer 50 in FIG. 3e would be deposited to a thickness of approximately half of the desired final oxide thickness. The masks 46 and 46.1 are then removed using a conventional wet etchant. Conventional techniques, such as those described above in U.S. Pat. No. 4,199,773, are then used to form transistors and other devices in and on the silicon islands 48 and 48.1.

The method of the present invention has a unique advantage of being able to grow silicon dioxide to any desired thickness between the island regions. Thus, the upper surface of the structure can be completely planarized. Alternatively, if it is desirable not to have a planarized surface, the amount of intrinsic epitaxial silicon deposited between the islands is reduced so that during the subsequent oxidation step the silicon dioxide does not grow to a thickness equal to the island thickness. This precise control of the silicon dioxide thickness is achieved in the method of the present invention by using the selective epitaxial growth technique to form intrinsic epitaxial silicon in the areas which surround the silicon islands.

The method of the present invention still has a further advantage in that it allows for the entire island sidewall to be doped. By doping the entire side wall, source-drain leakage due to sidewall edge-transistors is substantially eliminated.

I claim:

1. A method of forming a semiconductor device comprising the steps of:
    forming at least one island of semiconductor material on a surface of an insulating material;

applying a masking layer to the top of said at least one island;

forming intrinsic epitaxial silicon on the areas surrounding said at least one island by selective epitaxial growth; and oxidizing said intrinsic epitaxial silicon to form silicon dioxide regions which surround said at least one island.

2. A method of forming a semiconductor device in accordance with claim 1 wherein said insulating material is a sapphire substrate.

3. A method of forming a semiconductor device in accordance with claim 2 further comprising the step of forming silicon dioxide on the top and sidewalls of said at least one island before forming the silicon on the areas surrounding said at least one island.

4. A method of forming a semiconductor device in accordance with claim 1 wherein said insulating material is an island of silicon dioxide which is formed on the surface of a silicon substrate.

5. A method of forming a semiconductor device in accordance with claim 1 wherein said semiconductor material comprises single crystalline silicon having a first conductivity type.

6. A method of forming a semiconductor device in accordance with claim 5 further comprising the step of doping the sidewalls of said at least one island with a conductivity modifier of the same type as said first conductivity type before forming the silicon on the areas surrounding said at least one island.

7. A method of forming a semiconductor device in accordance with claim 1 wherein said mask comprises silicon nitride.

8. A method of forming a semiconductor device comprising the steps of:

forming at least one island of single crystalline silicon on the surface of a sapphire substrate;

applying an oxidation resistant masking layer to the top of said at least one island;

forming intrinsic epitaxial silicon on the areas of the sapphire substrate surrounding said at least one island by selective epitaxial growth; and heating the intrinsic epitaxial silicon formed on the areas of the sapphire substrate surrounding said at least one island in an oxidizing atmosphere to form silicon dioxide.

9. A method of forming a semiconductor device in accordance with claim 8 further comprising the step of forming a silicon dioxide layer on the top and sidewalls of said at least one island before forming the silicon on the areas of the sapphire substrate surrounding said at least one island.

10. A method of forming a semiconductor device in accordance with claim 9 wherein said oxidation resistant masking layer comprises silicon nitride.

11. A method of forming a semiconductor device in accordance with claim 9 wherein said silicon formed on the areas of the sapphire substrate surrounding said at least one island is grown to a thickness of about half of the thickness of said at least one island.

12. A method of forming a semiconductor device in accordance with claim 8 further comprising the step of doping the sidewalls of the said at least one island.

13. A method of forming a semiconductor device in accordance with claim 8 further comprising the step of forming a transistor in said at least one island.

14. A method of forming a semiconductor device comprising the steps of:

forming at least one island of insulating material on a surface of a silicon substrate;

forming a, layer of monocrystalline silicon on at least a portion of the exposed surface of said at least one island;

applying an oxidation resistant masking layer to said layer of monocrystalline silicon;

forming intrinsic epitaxial silicon on the areas of said silicon substrate surrounding said at least one island by selective epitaxial growth; and heating the intrinsic epitaxial silicon formed on the areas of the silicon substrate surrounding said at least one island in an oxidizing atmosphere to form silicon dioxide.

15. A method of forming a semiconductor device in accordance with claim 14 wherein said insulating material is selected from the group consisting of silicon nitride and silicon dioxide.

16. A method of forming a semiconductor device in accordance with claim 14 wherein said silicon formed on the areas of said silicon substrate surrounding said at least one island is grown to a thickness equal to about half of the total thickness of said at least one island and said layer of monocrystalline silicon formed on at least a portion of said at least one island.

17. A method of forming a semiconductor device in accordance with claim 14 wherein said oxidation resistant masking layer comprises silicon nitride.

18. A method of forming a semiconductor device in accordance with claim 14 further comprising the step of forming a transistor in said layer of monocrystalline silicon.

* * * * *